United States Patent
Halbritter

(10) Patent No.: US 9,153,727 B2
(45) Date of Patent: Oct. 6, 2015

(54) OPTOELECTRONIC DEVICE

(75) Inventor: Hubert Halbritter, Dietfurt (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/111,930

(22) PCT Filed: Apr. 15, 2011

(86) PCT No.: PCT/EP2011/056041
§ 371 (c)(1),
(2), (4) Date: Nov. 26, 2013

(87) PCT Pub. No.: WO2012/139662
PCT Pub. Date: Oct. 18, 2012

(65) Prior Publication Data
US 2014/0084307 A1 Mar. 27, 2014

(51) Int. Cl.
| | |
|---|---|
| *H01L 31/12* | (2006.01) |
| *H01L 31/167* | (2006.01) |
| *G01S 7/481* | (2006.01) |
| *G01S 17/02* | (2006.01) |
| *H01L 31/0232* | (2014.01) |
| *H01L 33/58* | (2010.01) |
| *H01L 31/173* | (2006.01) |
| *H01L 27/15* | (2006.01) |

(52) U.S. Cl.
CPC ............. *H01L 31/167* (2013.01); *G01S 7/4813* (2013.01); *G01S 17/026* (2013.01); *H01L 31/0232* (2013.01); *H01L 31/02325* (2013.01); *H01L 31/173* (2013.01); *H01L 33/58* (2013.01)

(58) Field of Classification Search
CPC ... H01L 31/167; H01L 31/0232; H01L 33/58; H01L 31/02325; H01L 31/0173; G01S 7/4813; G01S 17/026
See application file for complete search history.

(56) References Cited

U.S. PATENT DOCUMENTS

| | | | | |
|---|---|---|---|---|
| 5,760,390 | A | * | 6/1998 | Vezzalini et al. ............. 250/221 |
| 5,949,062 | A | * | 9/1999 | Matsumoto ................ 250/208.1 |
| 6,127,671 | A | | 10/2000 | Parsons et al. |
| 6,133,988 | A | | 10/2000 | Rhême et al. |
| 2002/0008876 | A1 | | 1/2002 | Terui et al. |
| 2004/0004197 | A1 | * | 1/2004 | Sano .......................... 250/559.4 |
| 2008/0049210 | A1 | * | 2/2008 | Takaoka ............................ 356/3 |
| 2011/0297832 | A1 | * | 12/2011 | Yao et al. ...................... 250/353 |

FOREIGN PATENT DOCUMENTS

| | | |
|---|---|---|
| CN | 86102577 A | 10/1986 |
| CN | 1469112 A | 1/2004 |

(Continued)

OTHER PUBLICATIONS

Nitto, Clear molding compound for optical semiconductor NITRON T(NT) Series, 2010.*

(Continued)

*Primary Examiner* — Galina Yushina
(74) *Attorney, Agent, or Firm* — DLA Piper LLP (US)

(57) ABSTRACT

An optoelectronic device having an optoelectronic component that receives or generates radiation and has a main radiation passage surface, wherein the component is assigned an aperture which defines a radiation cone for radiation passing through the main radiation passage surface, and the aperture has an inner surface having a region inclined away from the main radiation passage surface.

13 Claims, 4 Drawing Sheets

(56) References Cited

FOREIGN PATENT DOCUMENTS

| | | |
|---|---|---|
| CN | 101482618 A | 7/2009 |
| CN | 101936752 A | 1/2011 |
| DE | 35 13 671 A1 | 10/1986 |
| JP | 1-163350 | 6/1989 |
| JP | 2001-267626 | 9/2001 |
| JP | 2002-40136 | 2/2002 |
| JP | 2006-203111 | 8/2006 |
| JP | 2010-034189 | 2/2010 |
| WO | 2009/152820 | 12/2009 |

OTHER PUBLICATIONS

English Translation of the Notification of Reasons for Refusal dated Nov. 25, 2014 from corresponding Japanese Application No. 2014-504181.

English Translation of the Notification of the First Chinese Office Action dated Oct. 22, 2014 from corresponding Chinese Application No. 201180070154.2.

* cited by examiner

OPTOELECTRONIC DEVICE

TECHNICAL FIELD

This disclosure relates to an optoelectronic device.

BACKGROUND

In proximity sensors that detect the radiation emitted by a radiation source and reflected at a target object, stray radiation can lead to corruption of the measurement result.

SUMMARY

I provide an optoelectronic device including an optoelectronic component that receives or generates radiation and has a main radiation passage surface, wherein the component is assigned an aperture which defines a radiation cone for radiation passing through the main radiation passage surface, and the aperture has an inner surface having a region inclined away from the main radiation passage surface.

I also provide an optoelectronic device including an optoelectronic component that receives or generates radiation and has a main radiation passage surface, wherein the component is assigned an aperture defining a radiation cone for radiation passing through the main radiation passage surface, the aperture has an inner surface having a region inclined away from the main radiation passage surface, the device includes a carrier, the component being fixed to the carrier, the devices includes a frame, the frame being fixed to the carrier, a cutout in the frame forms the aperture, an inner surface of the aperture is absorbent in a targeted manner for the radiation to be received or to be generated, and the main radiation passage surface and the inclined region are arranged with respect to one another such that there is no direct beam path between the main radiation passage surface and the inclined region.

DETAILED DESCRIPTION

Figure 1:
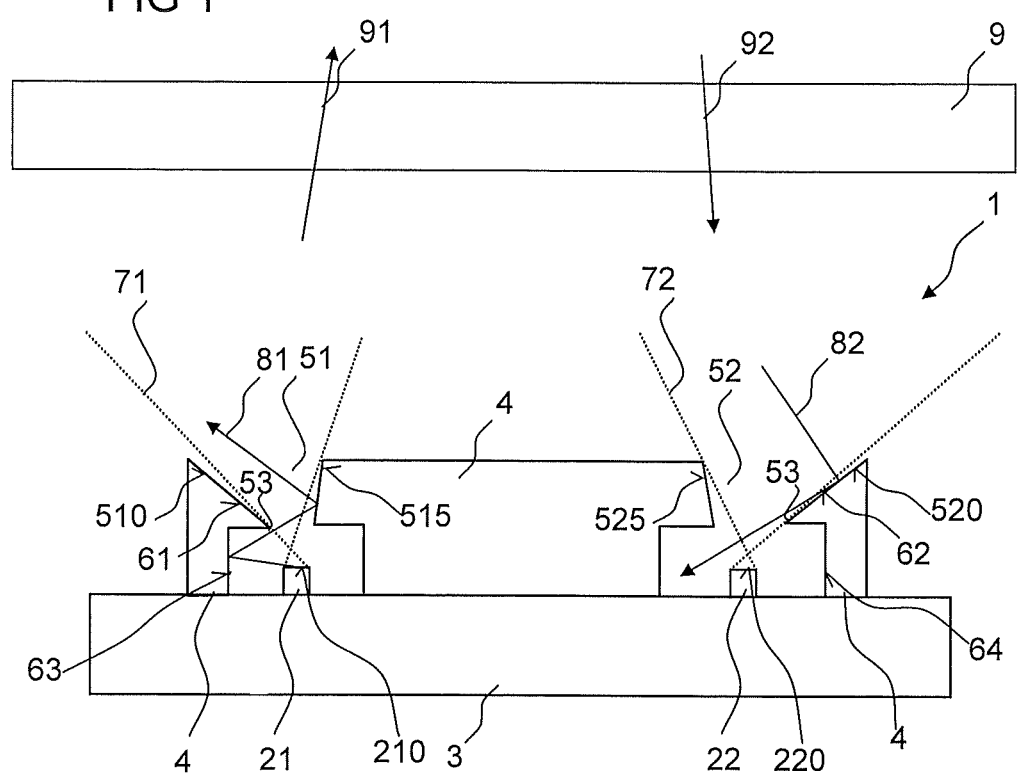
FIG. 1 shows a first example of an optoelectronic device in schematic sectional view.

There is thus a need to provide a simple optoelectronic device which can be produced cost-effectively and in which the influence of stray radiation is reduced.

I provide an optoelectronic device that may comprise an optoelectronic component provided to receive or generate radiation and may have a main radiation passage surface. The component is assigned an aperture which defines a radiation cone for the radiation passing through the main radiation passage surface. The aperture has an inner surface having a region inclined away from the main radiation passage surface.

In this context, "inclined away from the main radiation passage surface" means that in a vertical direction running perpendicular to the main radiation passage surface, a distance between the inclined region and the main radiation passage surface increases as a distance of the inclined region from the main radiation passage surface increases in a lateral direction running perpendicular to the vertical direction.

Preferably, the main radiation passage surface and the inclined region are arranged with respect to one another such that there is no direct beam path between the main radiation passage surface and the inclined region.

In other words, a beam course between the main radiation passage surface and the inclined region is free of a direct beam path.

A direct beam path between two locations or regions is understood to mean that radiation can pass in a straight line and without deflection within or outside the optoelectronic device from one location to the other, and vice versa.

Radiation reflected diffusely or directionally at the inclined region of the side surface can therefore only impinge on the main radiation passage surface if it experiences a deflection beforehand. Analogously, radiation emitted by the main radiation passage surface cannot impinge directly on the inclined region, but rather only after a preceding deflection.

That proportion of the total emitted or reflected radiation made up by the radiation emitted or reflected after reflection at the inner surface of the aperture can thus be reduced in a simple and cost-effective manner.

"Radiation cone" generally denotes a region from which, in the case of a radiation detector, radiation impinges on the main radiation passage surface through the aperture or into which, in the case of a radiation emitter, radiation is emitted by the main radiation passage surface through the aperture. On a side of the aperture facing away from the main radiation passage surface, the radiation cone can increase in cross section with increasing distance from the main radiation passage surface. The cross section of the radiation cone can have a circular, elliptical or polygonal basic shape.

Preferably, the inclined region is spaced apart from the main radiation passage surface in a direction running perpendicular to the main radiation passage surface.

Further preferably, the aperture is formed by a boundary of the inclined region facing the optoelectronic component. The boundary of the inclined region therefore regionally defines the radiation cone. A portion of stray radiation governed by the inner surface of the aperture can thus be reduced in a simple manner.

Further preferably, an extension line of the inclined region passes the main radiation passage surface on that side of the main radiation passage surface facing away from the inclined region. Thus, radiation reflected at the inclined region at an arbitrary angle cannot impinge directly on the main radiation passage surface. Analogously, radiation emerging from the main radiation passage surface cannot impinge directly on the inclined region.

Further preferably, the inner surface of the aperture has an undercut region on that side of the inclined region facing the component. In a lateral direction, therefore, the undercut region is at least regionally further away from the component than the inclined region.

Preferably, the inner surface having the inclined region and the undercut region is configured such that an impingement point of a beam passing through the aperture at a maximum angle with respect to the vertical direction on the undercut region, in a vertical direction, is at least as far away from the aperture, in particular from the boundary of the inclined region, as the main radiation passage surface. Radiation which impinges through the aperture directly on the undercut region and is reflected diffusely or directionally there therefore cannot impinge directly from the undercut region on the main radiation passage surface. Analogously, radiation emitted by the main radiation passage surface and impinging directly on the undercut region cannot emerge directly from the undercut region through the aperture.

Further preferably, the inclined region of the aperture is inclined away from the optoelectronic component to a greater extent than a further region of the inner surface of the aperture. In particular, the further region can be arranged on that side of the aperture which is situated opposite the inclined region. The further region of the inner surface can also run in a vertical direction.

The component is preferably fixed to a carrier. By way of example, a circuit board, for instance a printed circuit board (PCB), is suitable as carrier.

The aperture is furthermore preferably formed by a frame. In particular, a cutout that forms the aperture can be formed in the frame. The frame is expediently arranged on the carrier and furthermore preferably fixed thereto.

Preferably, the frame, in particular the inner surface of the aperture, is absorbent in a targeted manner for the radiation to be received or to be generated. Absorbent in a targeted manner means that the frame absorbs the radiation over and above a technologically unavoidable residual absorption. Preferably at least 60%, particularly preferably at least 80%, of the impinging radiation is absorbed. The higher the absorption, the smaller the proportion of radiation reflected at the frame.

The frame can be produced from an absorbent material or can be provided, for example, coated, with such a material. Particularly preferably, the frame is black to the human eye.

Preferably, the optoelectronic device has a further optoelectronic component, which together with the optoelectronic component forms an emitter-detector pair. The component can therefore be an emitter, and the further component as a detector, or vice versa.

The component is preferably a semiconductor component. The emitter is preferably formed as a luminescence diode, in particular as a light-emitting diode. A laser diode can also be employed. The detector is preferably formed as a diode, a phototransistor or as a radiation-sensitive integrated circuit (IC).

The features mentioned above with respect to the component can also be used for the further component. In particular, the further component is preferably assigned a further aperture which defines a radiation cone for the radiation passing through the further main radiation passage surface. The further aperture preferably has a further inner surface having a further region inclined away from the main radiation passage surface. The further main radiation passage surface and the further inclined region are furthermore preferably arranged with respect to one another such that there is no direct beam path between the further main radiation passage surface and the further inclined region.

Preferably, the further inclined region is formed on the side of the inner surface of the further aperture further away from the optoelectronic component. The inclined region is furthermore preferably formed on the side of the inner surface of the aperture further away from the further optoelectronic component. The proportion of stray radiation passing from the component to the further component and/or from the further component to the component can thus be reduced to the greatest possible extent.

The optoelectronic device can be produced particularly compactly and cost-effectively and is therefore suitable for many applications. Preferably, the optoelectronic device is a proximity sensor. In particular, the optoelectronic device is suitable as a proximity sensor in electronic appliances, for example, in handheld appliances, for instance in cellular phones.

Further features, configurations and expediencies will become apparent from the following description of the examples in conjunction with the figures.

Elements that are identical, of identical type or act identically are provided with the same reference signs in the figures.

The figures and the size relationships of the elements illustrated in the figures among one another should not be regarded as to scale. Rather, individual elements may be illustrated with an exaggerated size to enable better illustration and/or to afford a better understanding.

A first example of an optoelectronic device is illustrated in schematic sectional view in FIG. 1. In this example, the optoelectronic device is a proximity sensor.

The optoelectronic device 1 comprises a component 21 and a further component 22, which form an emitter-detector pair. In the example shown, by way of example, the component is an emitter and the further component is a detector. The components 21 and 22 are arranged on a carrier 3, for example, a circuit board, for instance a printed circuit board. On a side situated opposite the carrier, the component 21 and the further component 22 have a main radiation passage surface 210 and a further main radiation passage surface 220, respectively.

A frame 4 is arranged on the carrier 3. A cutout in the frame 4 forms an aperture 51 for the component 21. A further cutout forms a further aperture 52 for the further component. The aperture 51 defines a radiation cone 71, which is represented by a dotted boundary line in FIG. 1, for the radiation emitted from the main radiation passage surface 210. Radiation can be emitted into this radiation cone directly through the aperture. Correspondingly, the further aperture 52 defines a further radiation cone 72, which is represented by a dotted boundary line, for the radiation impinging directly on the further main radiation passage surface 220 of the further component 22.

A boundary 53 of the inclined region 61, the boundary facing the component 21, regionally forms the aperture 51 and thus defines the radiation cone 71 in this region. The boundary 53 is spaced apart from the main radiation passage surface 210 in a vertical direction running perpendicular to the main radiation passage surface 210. Correspondingly, a boundary 53 of the further inclined region 62, the boundary facing the further component 22, forms the further aperture 52 and defines the further radiation cone 72.

An inner surface 510 of the aperture 51 has a region 61 inclined away from the main radiation passage surface 210. The inclined region 61 of the aperture 51 is spaced apart from the main radiation passage surface in a vertical direction. In particular, the inclined region is disposed downstream of the main radiation passage surface in the emission direction. The inclined region 61 and the main radiation passage surface 210 are arranged with respect to one another such that radiation emitted from the main radiation passage surface 210 at an arbitrary angle cannot impinge directly on the inclined region 61.

The inclined region 61 is formed on the side of the aperture 51 which is the furthest away from the further component 22. The risk of radiation that impinges on the inner surface 510 in this region being directed in the direction of the further component 22 is thus reduced to the greatest possible extent.

A further region 515 of the inner surface 510, the further region being situated opposite the inclined region 61, can be arranged, by contrast, at a comparatively small angle with respect to a normal to the main radiation passage surface 210. In a departure from the example shown in FIG. 1, the further region can also run perpendicularly or substantially perpendicularly to the main radiation passage surface.

The inner surface 510 of the aperture 51 has an undercut region 63 on that side of the boundary 53 which faces the component. In this example, the undercut region 63 runs parallel or at least substantially parallel to the vertical direction. However, the undercut region can also be inclined relative to the vertical direction, in particular inclined away from the component 21.

As illustrated by an arrow 81, radiation impinging on the undercut region 63 cannot emerge from the aperture directly, but rather only after a further reflection at the further region 515 of the inner surface of the aperture 510. This portion of radiation is directed away from the further component 22 such that the proportion of stray radiation impinging on the further component 22 is reduced more extensively.

The component 21 is provided to emit electromagnetic radiation through a window 9. The window can be formed, for example, in a housing in which the optoelectronic device 1 is arranged. This portion of radiation that emerges is illustrated by an arrow 91. As illustrated by an arrow 92, the emitted useful radiation is partly reflected back through the window 9 from an object situated in proximity to the window 9 and can impinge on the further component 22.

The further aperture 52 has a further inner surface 520 having a further inclined region 62. As described in association with the component 21 which is an emitter, there is no direct beam path between the further inclined region 62 and the further main radiation passage surface 220. It is thus ensured in a simple manner that radiation which impinges on the inclined region 62, and is illustrated by an arrow 82, cannot impinge on the further main radiation passage surface 220 directly, that is to say cannot impinge thereon without a further reflection. The risk of, for example, stray radiation reflected at the window 9 impinging on the further component 22 is thus reduced to the greatest possible extent. As described in association with the aperture 51, the further inclined region 62 of the further aperture 52 is inclined to a greater extent than a further region 525 of the further inner surface 520, the further region being situated opposite the inclined region 62.

Furthermore, the further inner surface 520 has a further undercut region 64. The configuration of this further undercut region will be explained in greater detail in association with FIG. 4.

The component 21 is preferably formed as a luminescence diode, in particular as a light-emitting diode. The component preferably emits radiation in the near infrared range (NIR; vacuum wavelength 750 nm-1400 nm), particularly preferably in the wavelength range of 800 nm to 1000 nm.

The further component 22 is preferably formed as a photodiode or as a phototransistor. A photosensitive integrated circuit, for example, a specially formed application-specific integrated circuit (ASIC), can also be employed.

The further component is preferably based on silicon. In a departure from this, the further component can also be based on a different semiconductor material, for example, a III-V semiconductor material.

The frame 4 is preferably absorbent in a targeted manner for the radiation generated by the component 21. Preferably, at least 60%, particularly preferably at least 80%, of the radiation impinging on the frame 4 is absorbed. The higher the absorption, the lower the risk of radiation reflected at the frame impinging on the further component 22 after multiple reflections. The frame 4 is preferably produced from a plastic, for example, a black plastic. In a departure from this, the frame 4 can also be coated at least regionally with a radiation-absorbent material.

The frame 4 can be produced cost-effectively, for example, by an injection molding method or a transfer molding method. Alternatively, the frame can also be produced by mechanical machining, for example, by milling.

The component 21 and/or the further component 22 are/is preferably fixed to the carrier 3 using chip-on-board technology. That means that the components are mounted in an unpackaged fashion in the form of semiconductor chips on the carrier 3.

The device 1 described can be produced particularly compactly and cost-effectively and is suitable, for example, as a proximity sensor in handheld electronic appliances, for instance cellular phones.

Figure 2:
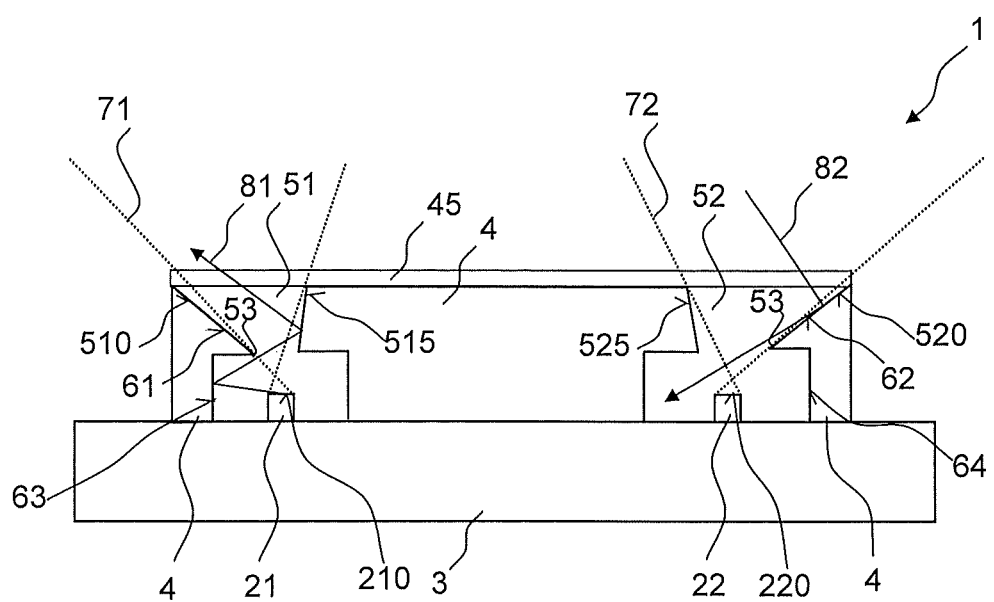
FIG. 2 shows a second example of an optoelectronic device in schematic sectional view.

A second example of an optoelectronic device is illustrated schematically in sectional view in FIG. 2. This second example substantially corresponds to the first example described in association with FIG. 1. In contrast thereto, a cover 45 is formed on that side of the frame 4 which faces away from the carrier 3. The cover 45 is provided in particular to protect the components 21, 22, in particular for protection against the ingress of dust or moisture through the apertures 51, 52. Expediently, the cover is transparent or at least translucent to the radiation emitted or detected during operation.

By way of example, a lamina or a film is suitable for the cover.

In a departure from the example described, as an alternative or in addition to the cover 45, the components 21, 22 can also be protected by an encapsulation into which the components are embedded. By way of example, an epoxide, a silicone or a hybrid material comprising at least one epoxide and a silicone is suitable for the encapsulation.

Figure 3:
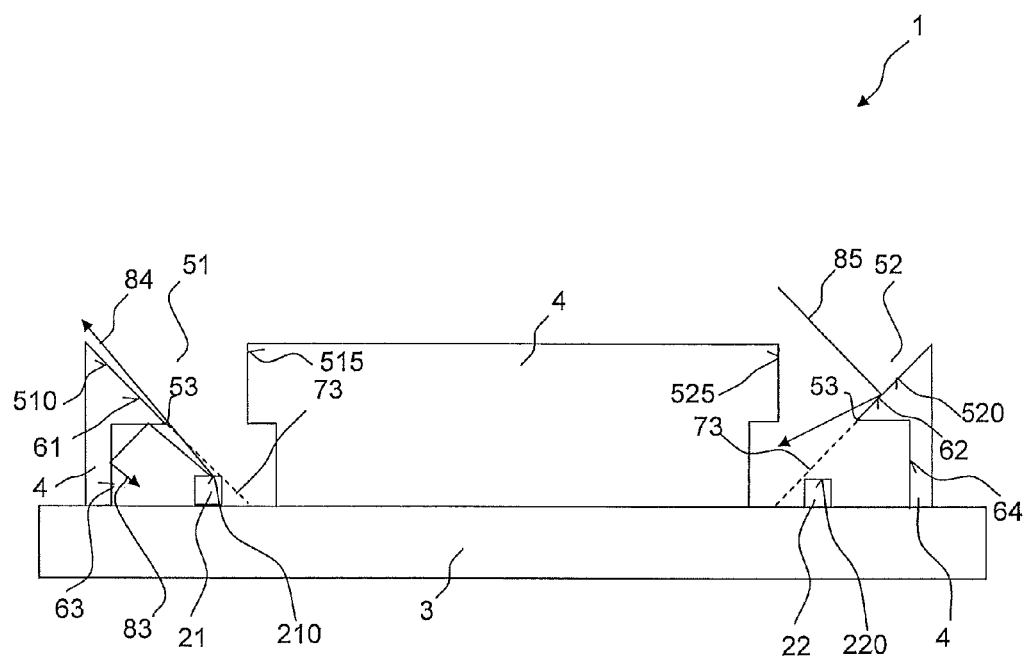
FIG. 3 shows a third example of an optoelectronic device in schematic sectional view.

The third example illustrated schematically in sectional view in FIG. 3 substantially corresponds to the first example described in association with FIG. 1. In contrast thereto, the further region 515 of the inner surface 510 of the aperture 51, the further region respectively being situated opposite the inclined region 61, and the further region 525 of the further inner surface 520 of the further aperture 52, the further region respectively being situated opposite the further inclined region 62, are perpendicular. However, the further regions 515, 525 can also be configured as described in association with FIG. 1. For the sake of improved illustration, the radiation cones 71, 72 are not explicitly depicted in FIGS. 3 and 4. They are defined, as described in association with FIG. 1, by the apertures 51, 52, in particular regionally by the boundary 53.

The component 21 and the inclined region 61 are arranged with respect to one another such that an extension line 73 of the inclined region passes the main radiation passage surface 210 on that side of the main radiation passage surface facing away from the inclined region. It is thus ensured in a simple manner that radiation emerging from the main radiation passage surface 210 cannot impinge directly on the inclined region 61. Radiation emitted in the direction of the inclined region 61 therefore is either deflected in the direction of the undercut region (represented by arrow 83) or emerges without reflection at the inner surface of the aperture directly through the aperture 51 (represented by arrow 84).

Analogously thereto, the extension line 73 of the further inclined region 62 passes the further component 22 on the side facing away from the further inclined region 62, such that radiation impinging on the further inclined region 62 (represented by arrow 85) cannot impinge directly on the further main radiation passage surface 220 even in the case of diffuse reflection at an arbitrary angle.

Figure 4:
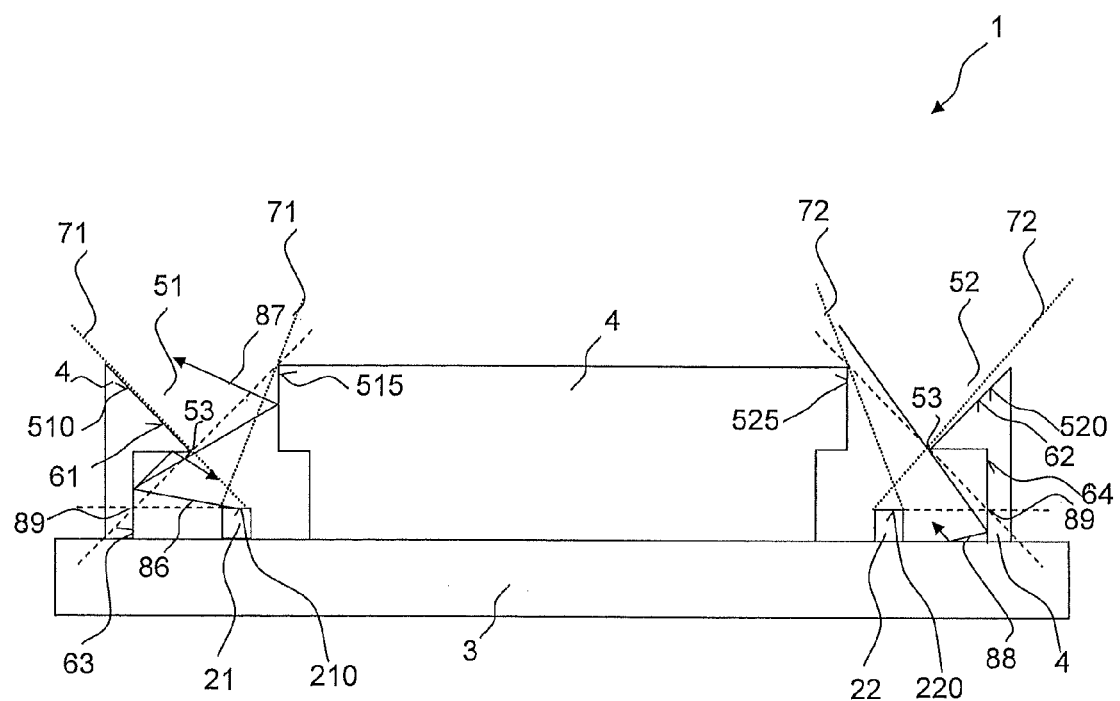
FIG. 4 shows a fourth example of an optoelectronic device in schematic sectional view.

The configuration of the undercut region 63 and respectively of the further undercut region 64 will be explained in greater detail on the basis of the fourth example, illustrated in FIG. 4.

The inner surface 510 of the aperture 51 having the undercut region 63 and the inclined region 61 is configured such that an impingement point 89 of a beam passing through the aperture at a maximum angle with respect to the vertical direction with the undercut region, in a vertical direction, is at least as far away from the aperture 51, in particular from the boundary 53 of the inclined region 61, as the main radiation passage surface 210. This is illustrated by a dashed line running in an extension of the main radiation passage surface 210.

It is thus simply ensured that radiation emitted by the component 21 and impinging on the undercut region 63 and reflected directionally or diffusely at an arbitrary angle cannot emerge directly from the aperture 51. This is illustrated by the arrows 86 and 87.

The further undercut region 64 of the further aperture 52 is analogous thereto. Thus, radiation impinging on the undercut region 64 and reflected directionally or diffusely at an arbitrary angle cannot impinge directly on the further main radiation passage surface 220 (arrow 88).

It goes without saying that, in a departure from the examples described, the apertures 51, 52 need not necessarily be identical. Depending on the requirements with respect to suppressing the stray radiation, it may also suffice if only one of the apertures 51, 52 has an inclined region.

The described configuration of the apertures 51, 52 makes it possible to realize, in a simple manner, an optoelectronic device in which the proportion of undesired stray radiation in the total signal can be reduced in a simple and cost-effective manner. Furthermore, the proportion of stray radiation can be minimized with an aperture which at the same time is comparatively large.

In a departure from the examples described, the configuration of the apertures 51, 52 described in association with an emitter-detector pair is also suitable for an optoelectronic device comprising only one optoelectronic component. In the case of an emitter, therefore, in the total emitted radiation power the proportion of stray radiation impinging on the aperture can be reduced and, in the case of a detector, the proportion of detected stray radiation can be reduced.

My devices and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. An optoelectronic device comprising an optoelectronic component that receives or generates radiation and has a main radiation passage surface, wherein
   the optoelectronic component is assigned an aperture which defines a radiation cone for radiation passing through the main radiation passage surface,
   the aperture has an inner surface having a region inclined away from the main radiation passage surface,
   the optoelectronic device has a further optoelectronic component with a further main radiation passage surface;
   the further optoelectronic component is assigned a further aperture defining a radiation cone for the radiation passing through the further main radiation passage surface;
   the further aperture has a further inner surface having a further inclined region inclined away from the main radiation passage surface;
   the inclined region is arranged at a larger angle with respect to a normal to the main radiation passage surface than a further region of the inner surface of the aperture being situated opposite the inclined region;
   the further inclined region is arranged at a larger angle with respect to a normal to the further main radiation passage surface than a further region of the further inner surface of the further aperture, the further region being situated opposite the further inclined region;
   the inclined region is formed on that side of the inner surface of the aperture which is further away from the further optoelectronic component; and
   the further inclined region is formed on that side of the further inner surface of the further aperture which is further away from the optoelectronic component.

2. The optoelectronic device according to claim 1, wherein the inclined region of the aperture is inclined away from the optoelectronic component to a greater extent than a further region of the inner surface of the aperture.

3. The optoelectronic device according to claim 1, wherein the component is fixed to a carrier and the aperture is formed by a frame arranged on the carrier wherein the frame is absorbent in a targeted manner for the radiation to be received or to be generated.

4. The optoelectronic device according to claim 1, wherein the optoelectronic device is a proximity sensor.

5. The optoelectronic device according to claim 1, wherein the inner surface absorbs at least 60% of impinging radiation.

6. The optoelectronic device according to claim 1, wherein the inclined region is spaced apart from the main radiation passage surface in a direction running perpendicular to the main radiation passage surface.

7. The optoelectronic device according to claim 6, wherein a boundary of the inclined region facing the optoelectronic component regionally defines the radiation cone.

8. The optoelectronic device according to claim 6, wherein an extension line of the inclined region passes the main radiation passage surface on a side of the main radiation passage surface facing away from the inclined region.

9. The optoelectronic device according to claim 6, wherein the inner surface of the aperture has an undercut region on a side of the inclined region facing the component.

10. The optoelectronic device according to claim 9, wherein the inner surface having the inclined region and the undercut region is arranged such that an impingement point of a beam passing through the aperture at a maximum angle with respect to the vertical direction on the undercut region, in a vertical direction, is at least as far away from the aperture as the main radiation passage surface.

11. The optoelectronic device according to claim 1, wherein the further optoelectronic component together with the optoelectronic component forms an emitter-detector pair.

12. The optoelectronic device according to claim 11, wherein the emitter is formed as a luminescence diode and the detector is formed as a photodiode, a phototransistor or as a radiation-sensitive IC component.

13. The optoelectronic device according to claim 11, wherein
   the further main radiation passage surface and the further inclined region are arranged with respect to one another such that there is no direct beam path between the further main radiation passage surface and the further inclined region.

* * * * *